(12) United States Patent
Ha et al.

(10) Patent No.: US 11,227,835 B2
(45) Date of Patent: Jan. 18, 2022

(54) SEMICONDUCTOR PACKAGE

(71) Applicant: SAMSUNG ELECTRONICS CO., LTD., Suwon-si (KR)

(72) Inventors: Job Ha, Suwon-si (KR); Jina Jeung, Suwon-si (KR); Sunghyun Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

(21) Appl. No.: 16/698,275

(22) Filed: Nov. 27, 2019

(65) Prior Publication Data
US 2020/0203279 A1  Jun. 25, 2020

(30) Foreign Application Priority Data

Dec. 20, 2018 (KR) .................. 10-2018-0166567

(51) Int. Cl.
| H01L 23/538 | (2006.01) |
| H01L 23/31 | (2006.01) |
| H01L 23/498 | (2006.01) |
| H01L 23/00 | (2006.01) |
| H01L 25/065 | (2006.01) |

(52) U.S. Cl.
CPC ...... *H01L 23/5384* (2013.01); *H01L 23/3121* (2013.01); *H01L 23/49811* (2013.01); *H01L 24/05* (2013.01); *H01L 24/13* (2013.01); *H01L 24/45* (2013.01); *H01L 25/0652* (2013.01); *H01L 2924/1306* (2013.01); *H01L 2924/13055* (2013.01)

(58) Field of Classification Search
CPC .................. H01L 23/5384; H01L 23/3121
See application file for complete search history.

(56) References Cited

U.S. PATENT DOCUMENTS

| 9,853,003 | B1 | 12/2017 | Han et al. | |
| 2014/0027889 | A1 | 1/2014 | Boone et al. | |
| 2017/0263518 | A1* | 9/2017 | Yu | H01L 25/00 |
| 2017/0287825 | A1* | 10/2017 | Lee | H01L 21/56 |
| 2017/0309571 | A1 | 10/2017 | Yi et al. | |
| 2018/0182691 | A1 | 6/2018 | Cho et al. | |
| 2019/0096862 | A1* | 3/2019 | Yu | H01L 23/49811 |
| 2019/0115300 | A1* | 4/2019 | Yu | H01L 25/50 |

FOREIGN PATENT DOCUMENTS

| KR | 10-2017-0121671 A | 11/2017 |
| KR | 10-2018-0012187 A | 2/2018 |
| KR | 10-2018-0073371 A | 7/2018 |

* cited by examiner

*Primary Examiner* — Mounir S Amer
(74) *Attorney, Agent, or Firm* — Sughrue Mion, PLLC

(57) ABSTRACT

A semiconductor package includes a frame having first and second surfaces opposite to each other, having first and second through holes, and including a wiring structure connecting the first and second surfaces, a connection structure disposed on the first surface of the frame and having a redistribution layer connected to the wiring structure, a first semiconductor chip having a first surface having a first pad connected to the redistribution layer and a second surface opposite to the first surface and having a second pad, a second semiconductor chip having an active surface having a connection pad connected to the redistribution layer and an inactive surface opposite to the active surface, an encapsulant encapsulating the first and second semiconductor chips, and a wiring layer connected to the second pad of the first semiconductor chip and the wiring structure.

19 Claims, 13 Drawing Sheets

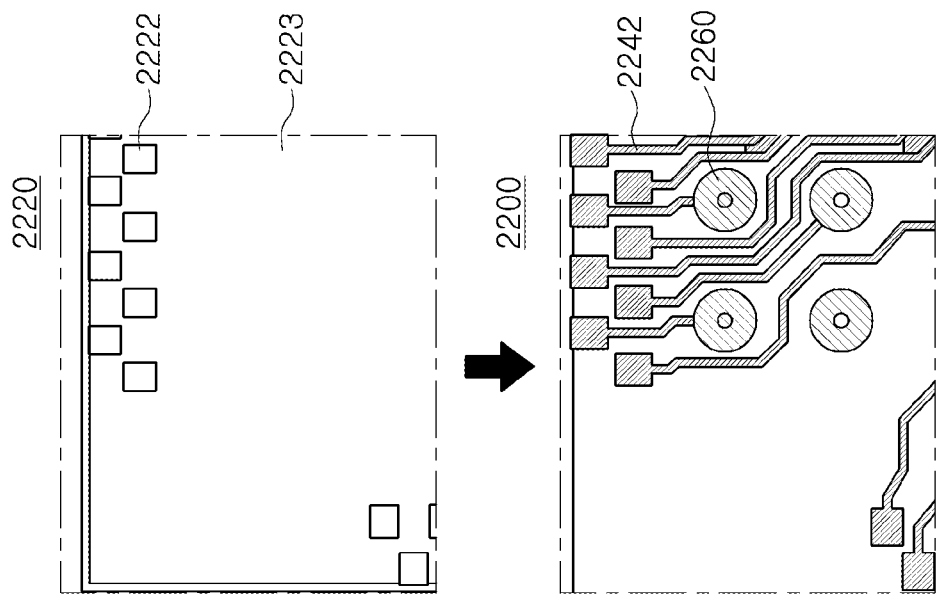
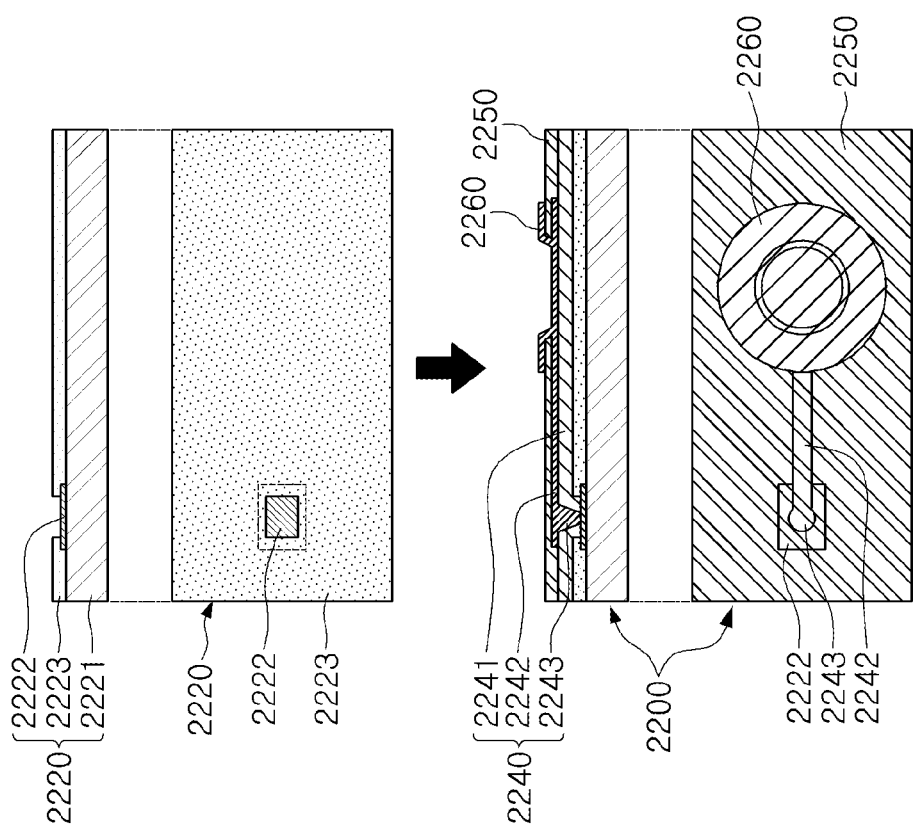
FIG. 3B
FIG. 3A

SEMICONDUCTOR PACKAGE

CROSS-REFERENCE TO RELATED APPLICATION

This application claims benefit of priority to Korean Patent Application No. 10-2018-0166567 filed on Dec. 20, 2018 in the Korean Intellectual Property Office, the disclosure of which is incorporated herein by reference in its entirety.

TECHNICAL FIELD

The present disclosure relates to a semiconductor package.

BACKGROUND

One important matter to be considered in designing power modules is reducing a size thereof, while integrating various devices (e.g., integrated circuit chips). Power modules in the related art have a structure in which various devices are mounted on a copper (Cu) lead frame, as a base, for solving a heat problem due to power IC switching, and terminals between such devices are connected by wire bonding. However, there is a restriction in arranging devices on the lead frame and the use of the wire bonding technology causes a limitation in a reduction of a package thickness.

SUMMARY

An aspect of the present disclosure may provide a semiconductor package having a structure appropriate for devices (e.g., power device chips) in various forms used in a power module.

According to an aspect of the present disclosure, a semiconductor package may include: a frame having first and second surfaces positioned to be opposite to each other, having at least first and second through holes, and including a wiring structure connecting the first and second surfaces; a connection structure disposed on the first surface of the frame and having a redistribution layer connected to the wiring structure; a first semiconductor chip disposed on the connection structure in the first through hole and having a first surface having first pads connected to the redistribution layer and a second surface positioned to be opposite to the first surface and having a second pad; a second semiconductor chip disposed on the connection structure in the second through hole and having an active surface having a connection pad connected to the redistribution layer and an inactive surface positioned to be opposite to the active surface; an encapsulant encapsulating the first and second semiconductor chips; and a wiring layer disposed on the encapsulant and the second surface of the frame and connected to the second pad of the first semiconductor chip and the wiring structure.

According to another aspect of the present disclosure, a semiconductor package may include: a frame having first and second surfaces positioned to be opposite to each other, having a plurality of through holes, and including a wiring structure connecting the first and second surfaces; a connection structure disposed on the first surface of the frame and having a redistribution layer connected to the wiring structure; a plurality of semiconductor chips disposed in the plurality of through holes, respectively, and each having a first surface having first pads connected to the redistribution layer and a second surface positioned to be opposite to the first surface and having a second pad; an encapsulant encapsulating the plurality of semiconductor chips; and a wiring layer disposed on the encapsulant and the second surface of the frame and connected to the second pad of the plurality of semiconductor chips and the wiring structure.

BRIEF DESCRIPTION OF DRAWINGS

The above and other aspects, features and other advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being package;

DETAILED DESCRIPTION

Hereinafter, exemplary embodiments in the present disclosure will be described in detail with reference to the accompanying drawings.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Figure 1:
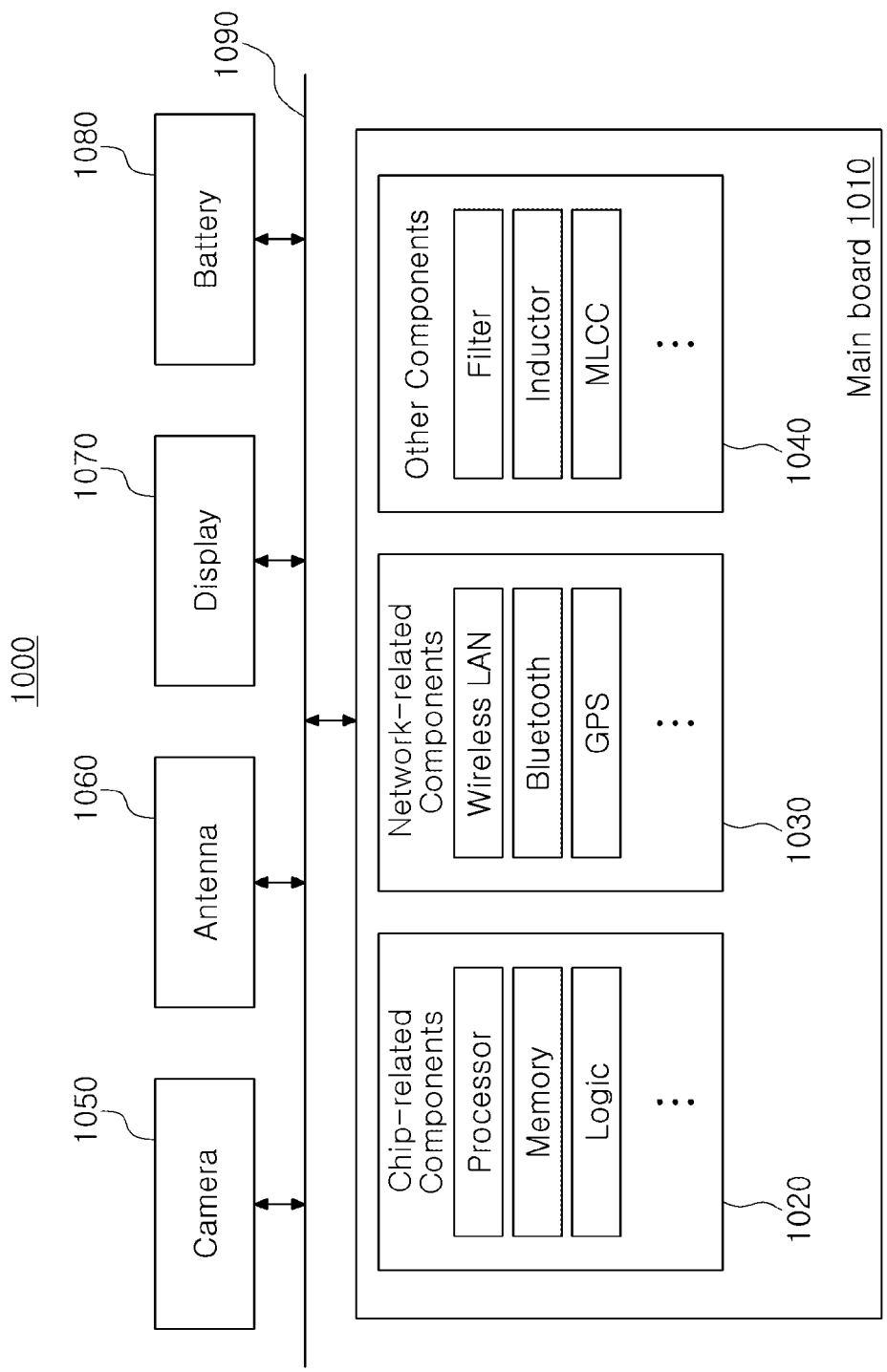
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
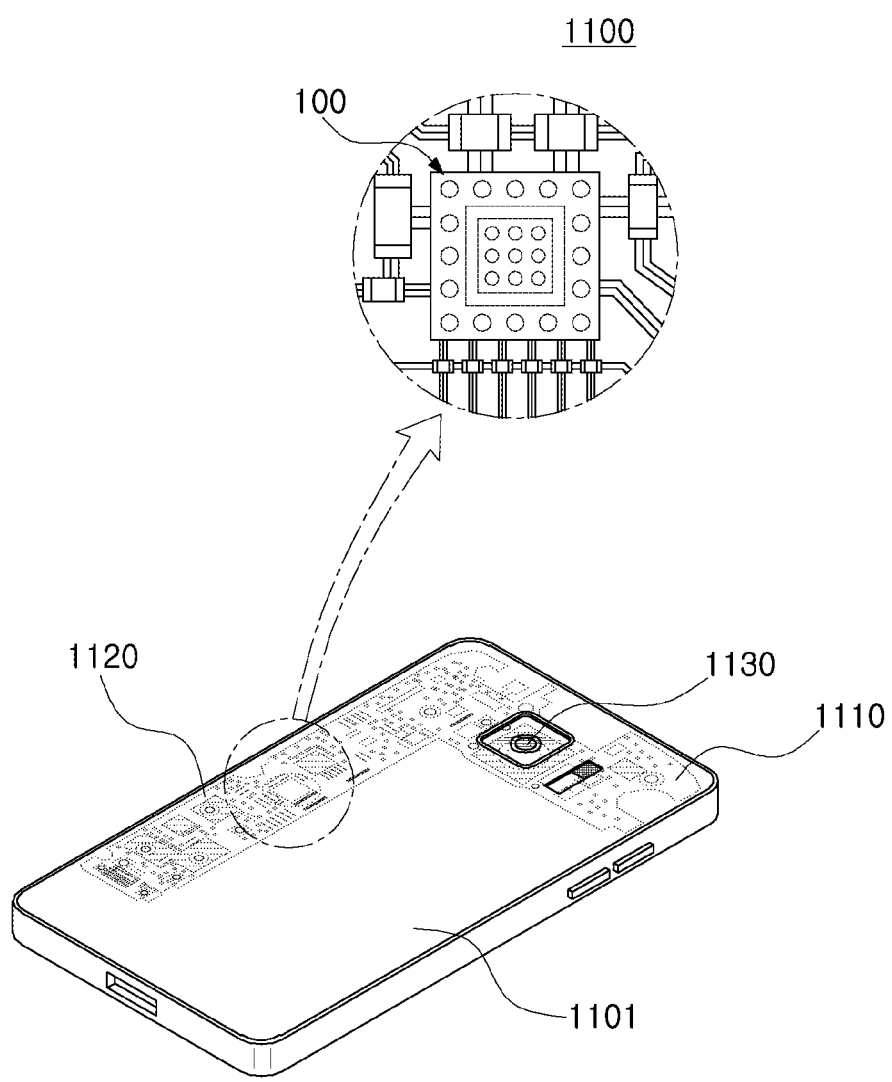
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and use of packaging technology for buffering a difference in a circuit width between the semiconductor and the mainboard is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 4:
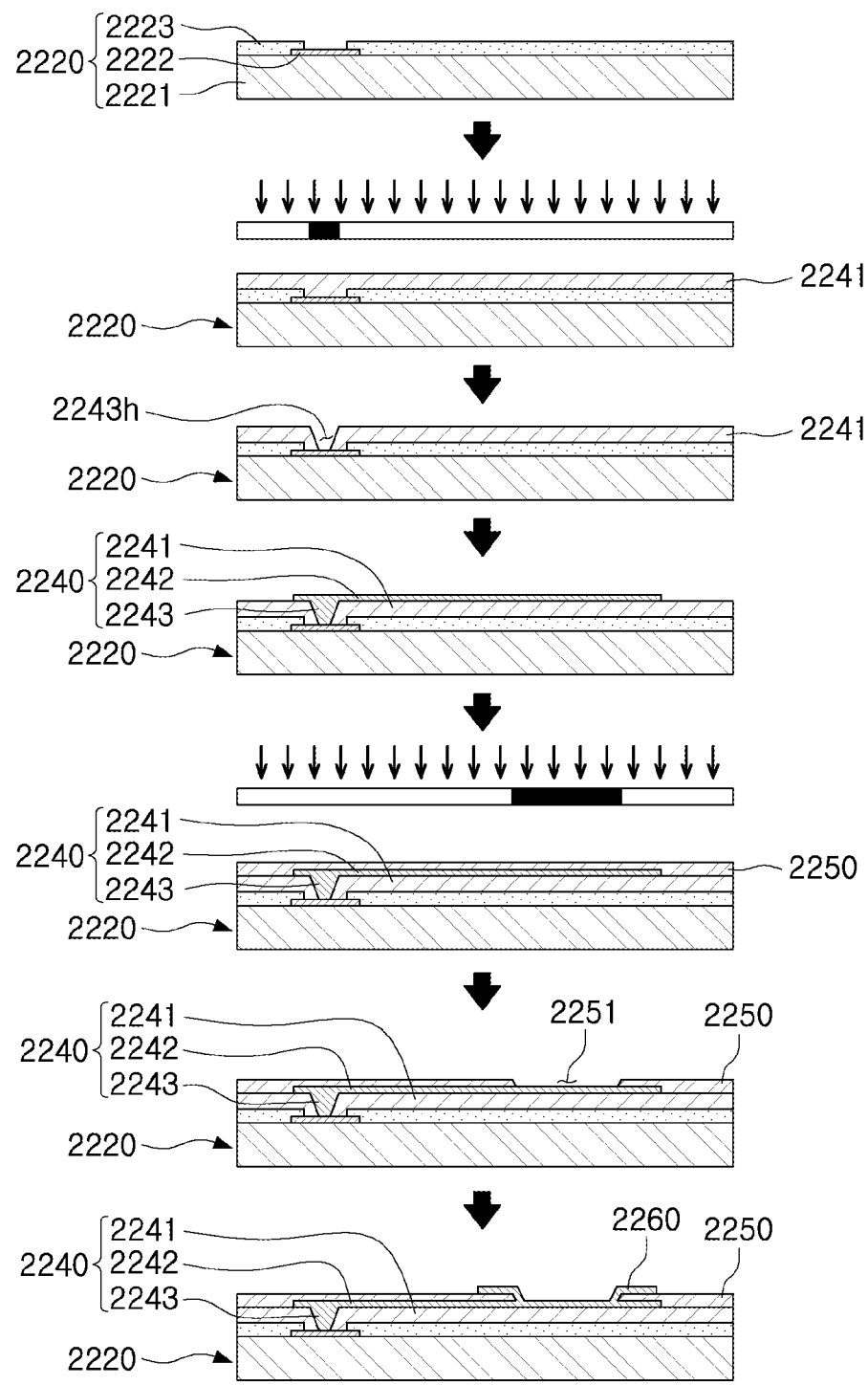
FIG. 4 is a schematic cross-sectional view illustrating a packaging process of a fan-in semiconductor package

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection structure 2240 may be formed on the semiconductor chip 2220 in order to redistribute the connection pads 2222. The connection structure 2240 may be formed by forming an insulating layer 2241 on the semiconductor chip 2220 using an insulating material such as a photo imageable dielectric (PID) resin, forming via holes 2243 opening on to the connection pads 2222, and then forming wiring patterns 2242 and vias 2243. Then, a passivation layer 2250 protecting the connection structure 2240 may be formed, and an opening 2251 may be formed to have an underbump metal layer 2260, or the like, extending therethrough. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the mainboard of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
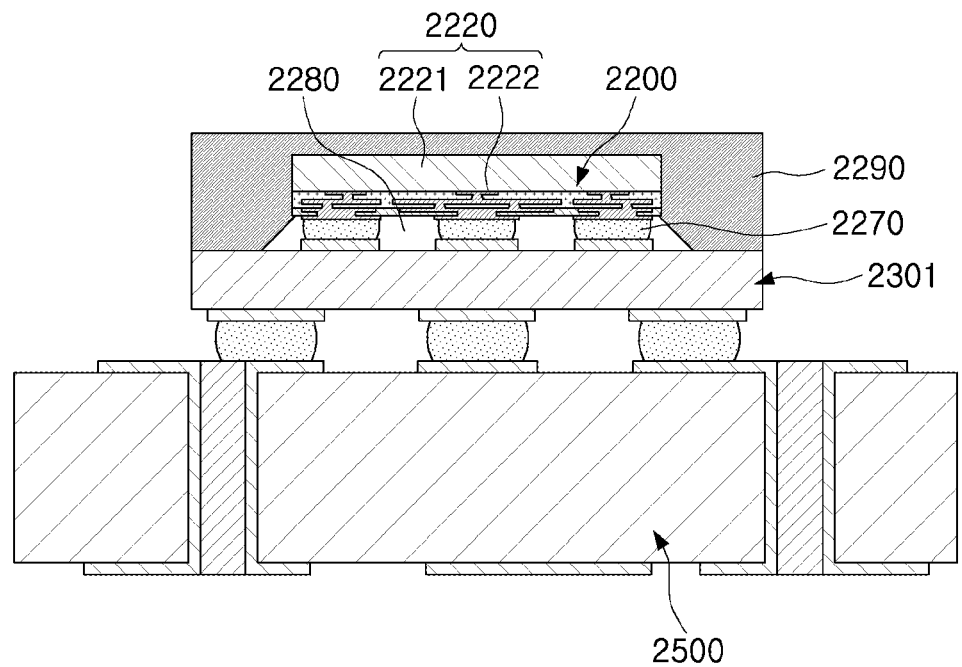
FIG. 5 is a schematic cross-sectional view illustrating a case in which a fan-in semiconductor package is mounted on an interposer substrate and is ultimately mounted on a mainboard of an electronic device.
Figure 6:
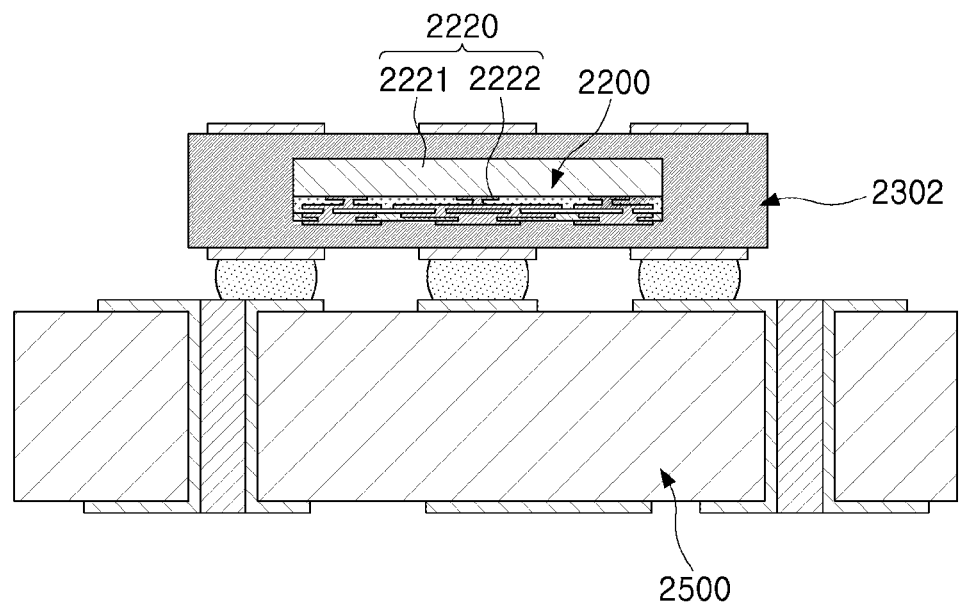
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a fan-in semiconductor package mounted on an interposer substrate that is ultimately mounted on a mainboard of an electronic device, and FIG. 6 is a schematic cross-sectional view illustrating a fan-in semiconductor package embedded in an interposer substrate that is ultimately mounted on a mainboard of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard (e.g., 2500) of the electronic device. Therefore, the fan-in semiconductor package may be mounted on the separate interposer substrate (e.g., 2301 or 2302) and be then mounted on the mainboard of the electronic device through a packaging process or may be mounted and used on the mainboard of the electronic device in a state in which it is embedded in the interposer substrate.

Fan-Out Semiconductor Package

Figure 7:
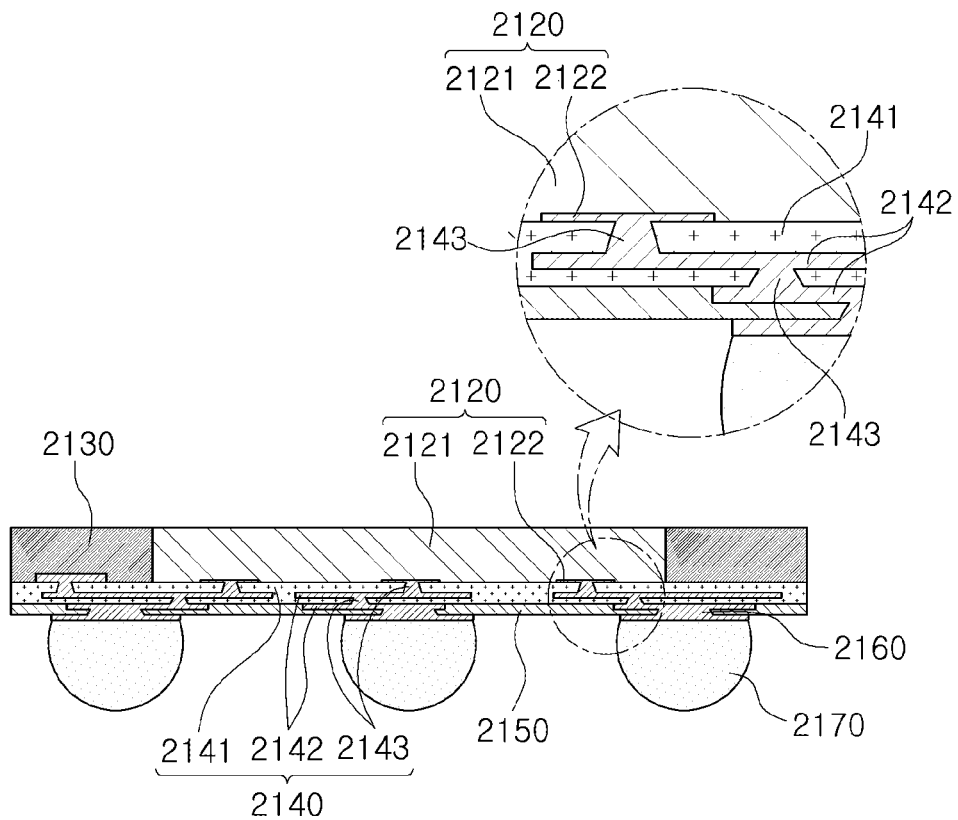
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2202 may be further formed on the connection structure 2140, and an underbump metal layer 2160 may be further formed in openings of the passivation layer 2202. Solder balls 2170 may be further formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection structure 2140 may be formed after the encapsulant 2130 is formed outside the semiconductor chip 2120. In this case, a process for forming the connection structure 2140 is performed from the via (s) connected to the connection pads 2122 of the semiconductor chip 2120 and the redistribution layer, and thus, the vias 2143 may have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection structure 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. Meanwhile, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection structure 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the mainboard of the electronic device without using a separate interposer substrate, as described below.

Figure 8:
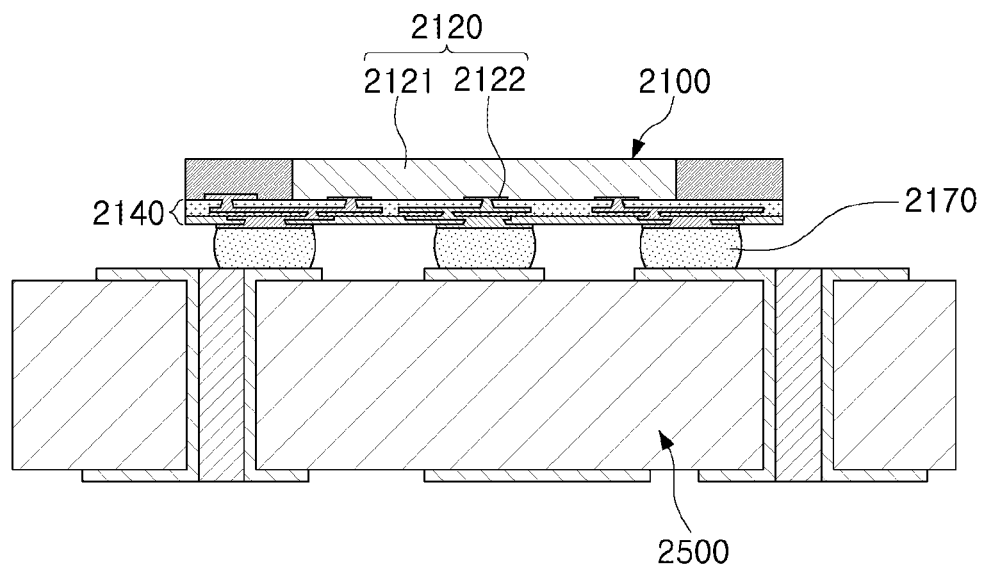
FIG. 8 is a schematic cross-sectional view illustrating a case in which a fan-out semiconductor package is mounted on a mainboard of an electronic device.

FIG. 8 is a schematic cross-sectional view illustrating a fan-out semiconductor package mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the mainboard of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments in the present disclosure will be described in detail with reference to the accompanying drawings.

Figure 9:
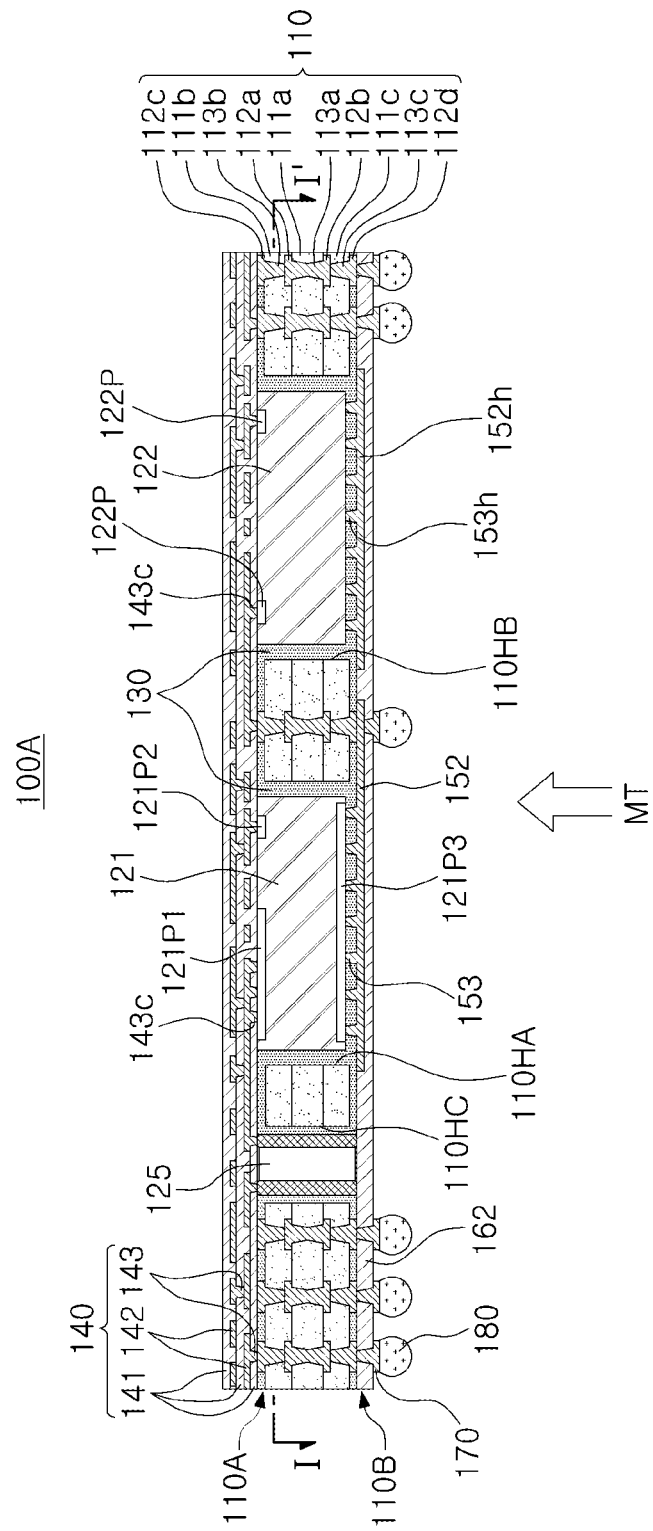
FIG. 9 is a schematic cross-sectional view of a semiconductor package according to an exemplary embodiment in the present disclosure.
Figure 10:
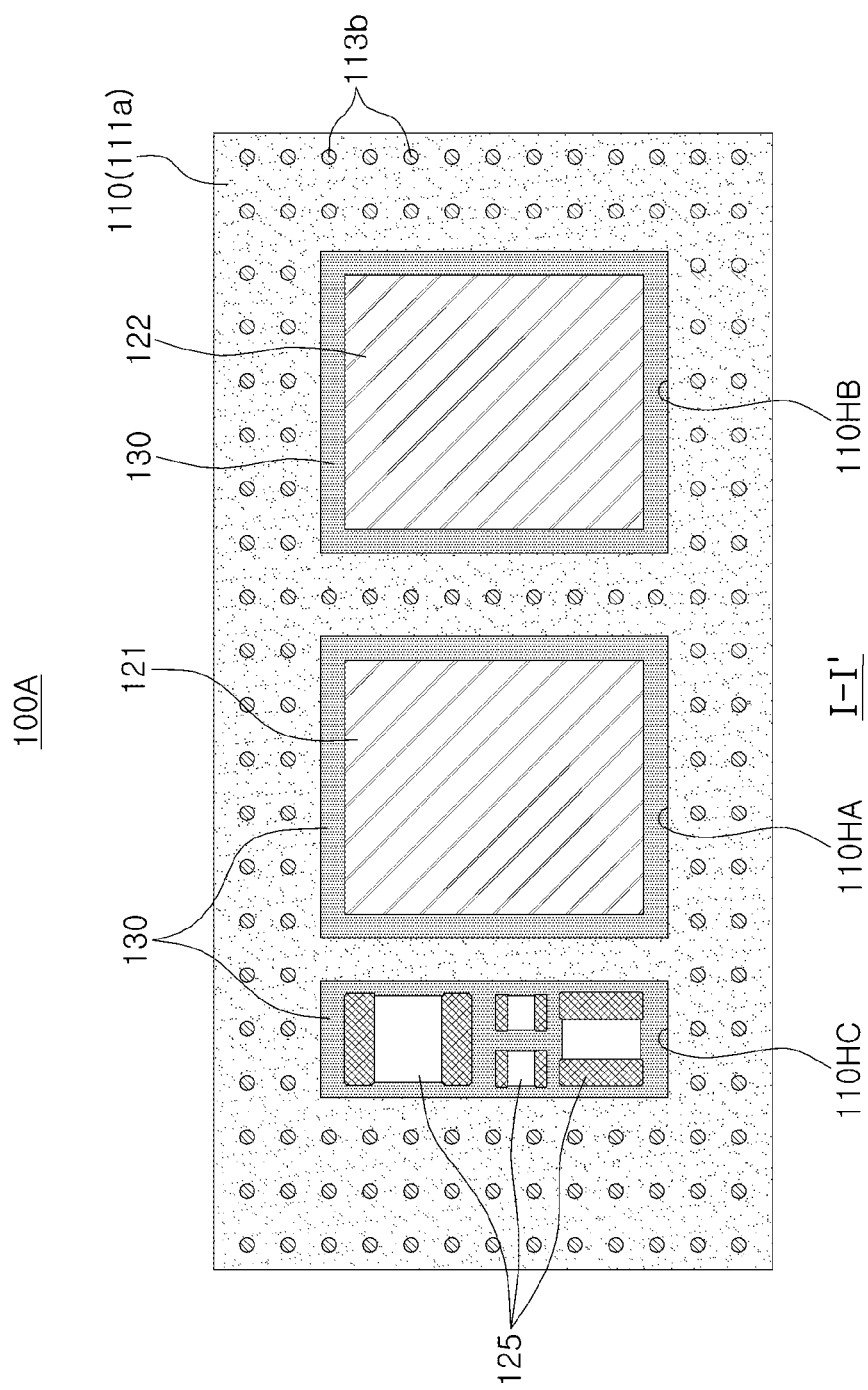
FIG. 10 is a plan view of the semiconductor package of FIG. 9 taken along line I-I'.

FIG. 9 is a schematic cross-sectional view illustrating a semiconductor package according to an exemplary embodiment in the present disclosure, and FIG. 10 is a plan view of the semiconductor package of FIG. 9 taken along line I-I'.

Referring to FIGS. 9 and 10, the semiconductor package 100A according to the present exemplary embodiment includes a frame 110 having a first surface 110A and a second surface 110B positioned to oppose each other, and has first and second through holes 110HA and 110HB, a connection structure 140 disposed on the first surface 110A of the frame 110, first and second semiconductor chips 121 and 122 respectively disposed in the first and second through holes 110HA and 110HB, and an encapsulant 130 encapsulating the first and second semiconductor chips 121 and 122.

In this exemplary embodiment, the frame 110 may further include a third through hole 110HC for accommodating a passive component 125. The passive component 125 may be disposed in the third through hole 110HC and encapsulated by the encapsulant 130.

The frame 110 may include an insulating member in which a plurality of insulating layers 111a, 111b, and 111c are stacked. The wiring structure may include a plurality of wiring patterns 112a, 112b, 112c, and 112d formed on the plurality of insulating layers 111a, 111b, and 111c and a plurality of wiring vias 113a, 113b, and 113c respectively penetrating through the plurality of insulating layers 111a, 111b, and 111c and connecting the plurality of wiring patterns 112a, 112b, 112c, and 112d.

The frame 110 employed in the present exemplary embodiment includes the first insulating layer 111a and second and third insulating layers 111b and 111c respectively disposed on opposing surfaces of the first insulating layer 111a. The wiring structure includes the first and second wiring patterns 112a and 112b respectively disposed on opposing surfaces of the first insulating layer 111a, the third wiring pattern 112C disposed on the second insulating layer 111b, the fourth wiring pattern 112d disposed on the third insulating layer 111c, the first wiring via 113a penetrating through the first insulating layer 111a and connecting the first and second wiring patterns 112a and 112b, the second wiring via 113b penetrating through the second insulating layer 111b and connecting the second and third wiring patterns 112b and 112c, and the third wiring via 113c penetrating through the third insulating layer 111c and connecting the third and fourth wiring patterns 112c and 112d. In another exemplary embodiment, the frame and the wiring structure may be modified in design to have various forms. For example, the insulating member may have a different number of insulating layers, and the wiring structure may have a different structure (see FIG. 12, for example).

The connection structure 140 may include a plurality of insulating layers 141 disposed on the first surface 110A of the frame 110, a plurality of redistribution layers 142 disposed on the plurality of insulating layers 141, and a redistribution via 143 penetrating through each of the insulating layers and connected to the plurality of redistribution layers. The redistribution layer 142 may be connected to the wiring structure (in particular, the third wiring pattern 112c) by the redistribution via 143. The redistribution layer 142 employed in this exemplary embodiment is illustrated as a two-level redistribution layer, but in another exemplary embodiment, the redistribution layer 142 may include a single layer or a redistribution layer of three or more levels (see FIG. 11, for example).

The redistribution layer 142 may be electrically connected to each of the first and second semiconductor chips 121 and 122 and the passive component 125.

The first semiconductor chip 121 has a first surface having a plurality of first pads 121P1 and 121P2 connected to the redistribution layer 142 and a second surface opposite to the first surface and having a second pad 121P3.

The plurality of first pads 121P1 and 121P2 of the first semiconductor chip 121 each may be connected to the redistribution layer 142 through connection vias 143c. The second pad 121P3 of the first semiconductor chip 121 may be exposed from the encapsulant 130 and electrically connected to a wiring layer 152 disposed on the encapsulant 130. As illustrated in FIG. 9, the wiring layer 152 may be connected to the second pad 121P3 through a plurality of vias 153. The wiring layer 152 may extend to cover the second surface 110B of the frame 110 and be connected to the wiring structure (in particular, the fourth wiring pattern 112d) of the frame 110.

In some exemplary embodiments, the first semiconductor chip 121 may include a power device, such as a power management integrated circuit (PMIC). For example, the first semiconductor chip 121 may be at least one of an insulated gate bipolar transistor (IGBT) chip and a field effect transistor (FET) chip. Specifically, in the case of the IGBT chip, the plurality of first pads 121P1 and 121P2 may be an emitter (or collector) electrode and a gate electrode, respectively, and the second pad 121P3 may be a collector (or emitter) electrode. In the case of the FET chip, the plurality of first pads 121P1 and 121P2 may be a source (or drain) electrode and a gate electrode, respectively, and the second pad 121P3 may be a drain (or source) electrode.

The second semiconductor chip 122 has an active surface having a connection pad 122P connected to the redistribution layer 142 and an inactive surface located opposite to the active surface. The connection pad 122P of the second semiconductor chip 122 may be connected to the redistribution layer 142 through the connection vias 143c.

In some exemplary embodiments, the second semiconductor chip 122 may include a control integrated circuit chip. For example, the second semiconductor chip 122 may include an IC chip implemented with a central processing unit (CPU) and/or a field programmable gate array (FPGA).

In this manner, the semiconductor package 100A according to the present exemplary embodiment may be realized as a power module. The second semiconductor chip 122 includes an IC chip requiring a low voltage and a large current such as a CPU and an FPGA, and the first semiconductor chip 121 may include a power device chip for supplying a low voltage and large current required for the first semiconductor chip 121. In order to prevent voltage drop due to wiring impedance, wiring impedance of the first and second semiconductor chips 121 and 122 needs to be lowered. In this exemplary embodiment, the first semiconductor chip 121 is connected to the second semiconductor chip 122 using the redistribution layer 142 and the wiring layer 152 respectively disposed on opposing surfaces of the first semiconductor chip 121, without a bonding wire, thus having low wiring impedance.

The semiconductor package 100A may further include a heat dissipation layer 152h disposed in a region corresponding to the inactive surface of the second semiconductor chip 122 in the encapsulant 130. In this case, the heat dissipation layer 152h may be formed together with the wiring layer 152. For example, the heat dissipation layer 152h may be formed together with the wiring layer 152 through the same plating process. The heat dissipation layer 152h and the wiring layer 152 are located at the same level and may include the same material (e.g., copper).

In the present exemplary embodiment, the heat dissipation layer 152h may be connected to the inactive surface of the second semiconductor chip 122 through a plurality of heat dissipation vias 153h partially penetrating the encapsulant 130, similarly to the wiring layer 152. Heat generated from the second semiconductor chip 122 may be transmitted to the heat dissipation layer 152h through the plurality of heat dissipation vias 153h and may be discharged to the outside. The wiring layer 152 may also be used as a heat dissipation part for the first semiconductor chip 121, as with the heat dissipation layer 152h, as well as electrical connection.

The semiconductor package 100A includes a passivation layer 162 covering the second surface 110B of the frame 110 and the wiring layer 152 and an underbump metal (UBM) layer 170 electrically connected to the wiring structure (in particular, the fourth wiring pattern 112d) through the passivation layer 162. Also, the semiconductor package 100A may include an electrically connecting metal 180 on the UBM layer 170.

Hereinafter, each component included in the semiconductor package 100 according to the present exemplary embodiment will be described in more detail.

The frame 110 may further improve rigidity of the package 100 according to a specific material and may serve to ensure uniformity of a thickness of the encapsulant 130. The first and second semiconductor chips 121 and 122 and the plurality of passive components 125 may be disposed to be spaced apart, by a predetermined distance, from wall surfaces of the first to third through holes 110HA, 110HB, and 110HC, respectively. The first and second semiconductor chips 121 and 122 and the plurality of passive components 125 may be modified as necessary, and the plurality of through holes 110HA, 110HB, and 110HC may be vary in number and shape.

The insulating member of the frame 110 may include a thermosetting resin such as epoxy resin, a thermoplastic resin such as polyimide, or a resin obtained by impregnating a core material such as glass fiber (or glass cloth, glass fabric, etc.) with the thermosetting resin and the thermoplastic resin, together with an inorganic filler, but is not limited thereto. For example, the insulating member may be a prepreg, an ABF (Ajinomoto Build-up Film), FR-4, bismaleimide triazine (BT), or the like. In some exemplary embodiments, a photo-imageable dielectric (PID) resin may be used.

The first and second semiconductor chips 121 and 122 may be integrated circuits (ICs) in which hundreds to millions of devices are integrated in one chip. Meanwhile, the first and second semiconductor chips 121 and 122 may be ICs in a bare state in which no separate bump or redistribution layer is formed. The ICs may be formed based on an active wafer. In this case, silicon (Si), germanium (Ge), gallium arsenide (GaAs), or the like, may be used as a base material of a body of the first and second semiconductor chips 121 and 122. The body may have various circuits. The pads 121P1 to 121P3 and 122P may be formed of a conductive material such as aluminum (Al), or the like, but is not limited thereto. In some exemplary embodiments, a passivation film (not shown) exposing the pads 121P1 to 121P3 and 122P may be formed on the body. The passivation film (not shown) may be an oxide film, a nitride film or a dual-layer of an oxide film and a nitride film. An insulating film (not shown), or the like, may be further disposed at other positions as necessary.

The plurality of passive components 125 may be independently a multilayer ceramic capacitor (MLCC), a low inductance chip capacitor (LICC), an inductor, a bead, and various other types of filters. Each passive component 125 may have a different thickness. Further, each passive component 125 may have a thickness different from that of the first and second semiconductor chips 121 and 122.

The encapsulant 130 encapsulates at least some of the frame 110, the first and second semiconductor chips 121 and 122, and the plurality of passive components 125. Also, the encapsulant 130 may fill at least some of the plurality of through holes 110HA, 110HB, and 110HC. The encapsulant 130 includes an insulating material. As the insulating material, a material including an inorganic filler and an insulating resin, for example, a thermosetting resin such as an epoxy resin, a thermoplastic resin such as polyimide, or a resin containing a reinforcing material such as an inorganic filler in the thermosetting resin or the thermoplastic resin, specifically ABF, FR-4, BT resin, or the like, may be used. Further, a known molding material such as EMC may be used, and if necessary, a photo imageable encapsulant (PIE) may be used. If necessary, a material obtained by impregnating a core material such as an inorganic filler and/or glass fiber (or glass cloth, glass fabric, etc.) with an insulating resin such as a thermosetting resin or a thermoplastic resin may be used.

The insulating layer 141 of the connection structure 140 may be formed of the above-described insulating material, and in some exemplary embodiments, a photosensitive insulating material such as a PID resin may be used. When the insulating layer 141 is formed of a photosensitive material, the insulating layer 141 may be formed to be thinner and the redistribution vias 143 may be arranged at fine pitches. When the insulating layer 141 is formed as multiple layers, materials thereof may be the same as each other or may be different from each other as necessary. Although the insulating layer 141 is formed as multiple layers, the multiple layers may be integrated according to a process, and thus, boundaries therebetween may not be apparent.

The redistribution layer 142 may substantially serve to redistribute the pads 121P1 to 121P3 and 122P. For example, the redistribution layer 142 may be formed of a conductive material such as copper (Cu), aluminum (Al), silver (Ag), tin (Sn), gold (Au), nickel (Ni), lead (Pb), titanium (Ti), or an alloy thereof. The redistribution layer 142 may perform various functions according to a design of the corresponding layer. For example, the redistribution layer 142 may include a ground (GND) pattern, a power (PoWeR: PWR) pattern, a signal (S) pattern, and the like. Here, the signal (S) pattern includes various signals excluding the ground (GND) pattern, the power (PWR) pattern, and the like, for example, a data signal. The redistribution layer 142 may also include a via pad, a connection terminal pad, and the like.

The redistribution via 143 electrically connects the redistribution layer 142 and the pads 121P1, 121P2, and 122P formed at different layers, thus resultantly reconfiguring an electrical path in the semiconductor package 100A. For example, the redistribution via 143 may be formed of copper, aluminum, silver, tin, gold, nickel, lead, titanium, or an alloy thereof, and the like. The redistribution via 143 may be completely filled with a conductive material and may have various shapes such as a taper shape and a cylindrical shape.

The passivation layer 162 may protect the semiconductor package 100A from external physical or chemical damage. The passivation layer 162 may have an opening exposing at least a portion of the wiring layer 152 and the wiring structure. The opening may be formed as tens to thousands openings in the passivation layer 162. The passivation layer 162 may include an insulating resin and an inorganic filler but may not include glass fiber. For example, the passivation layer 162 may be ABF but is not limited thereto.

The UBM layer 170 improves connection reliability of the electrically connecting metal 180 and resultantly improves board level reliability of the semiconductor package 100. The UBM layer 170 may be connected to at least a portion of the wiring layer 152 and the wiring structure exposed through the opening of the passivation layer 162. The UBM layer 170 may be formed in the opening of the passivation layer 162 using a known conductive material, i.e., a metal, by a known metallization method but the present disclosure is not limited thereto.

The electrically connecting metal 180 is an additional component for physically and/or electrically connecting the semiconductor package 100A to the outside. For example, the semiconductor package 100A may be mounted on a mainboard of an electronic device through the electrically connecting metal 180. The electrically connecting metal 180 may be formed of a conductive material, e.g., a solder, or the like. The electrically connecting metal 180 may be a land, a ball, a pin, or the like. The electrically connecting metal 180 may be formed of multiple layers or a single layer. In a case where the electrically connecting metal 180 is formed of multiple layers, it may include a copper pillar and a solder. In a case where the electrically connecting metal 180 is formed of a single layer, it may include tin-silver solder or copper, but is not limited thereto. The number, spacing, arrangement form, and the like of the electrically connecting metal 180 is not particularly limited. For example, the number of the electrically connecting metals 180 may be several tens to several thousands depending on the number of pads 121P1 to 121P3 and 122P or may be greater or smaller.

At least a part of the electrically connecting metal 180 may be disposed in the fan-out region. The 'fan-out' region refers to a region outside a region in which the first and second semiconductor chips 121 and 122 are disposed. The fan-out package is more reliable than a fan-in package, may include a plurality of I/O terminals, and facilitates 3D interconnection. In addition, the fan-out package may be manufactured to have a small thickness as compared with a ball grid array (BGA) package and a land grid array (LGA) package.

Figure 11:
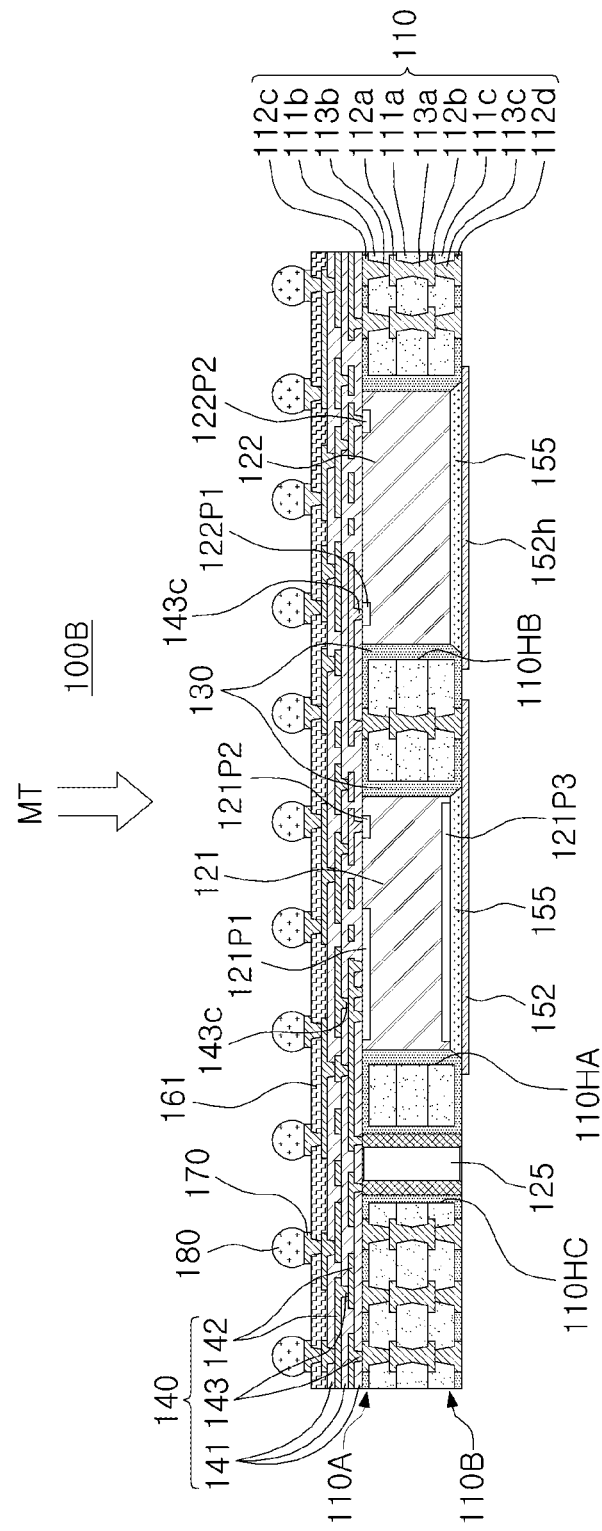
FIGS. 11 through 14 are schematic cross-sectional views illustrating a semiconductor package according to various exemplary embodiments in the present disclosure.

FIG. 11 is a schematic cross-sectional view illustrating a semiconductor package according to an exemplary embodiment in the present disclosure.

Referring to FIG. 11, a semiconductor package 100B according to the present exemplary embodiment may be understood to be similar to the structures illustrated in FIGS. 9 and 10, except that a connecting structure of a first semiconductor chip (or a second semiconductor chip) and a wiring layer (or a heat dissipation layer) is different, a connection structure 140 includes a three-level redistribution layer 142, and a mounting surface MT is the opposite. For components of the present exemplary embodiment, the descriptions of the components which are the same as or similar to those of the semiconductor package 100A illustrated in FIGS. 9 and 10 may be referred to unless otherwise mentioned.

Figure 12:
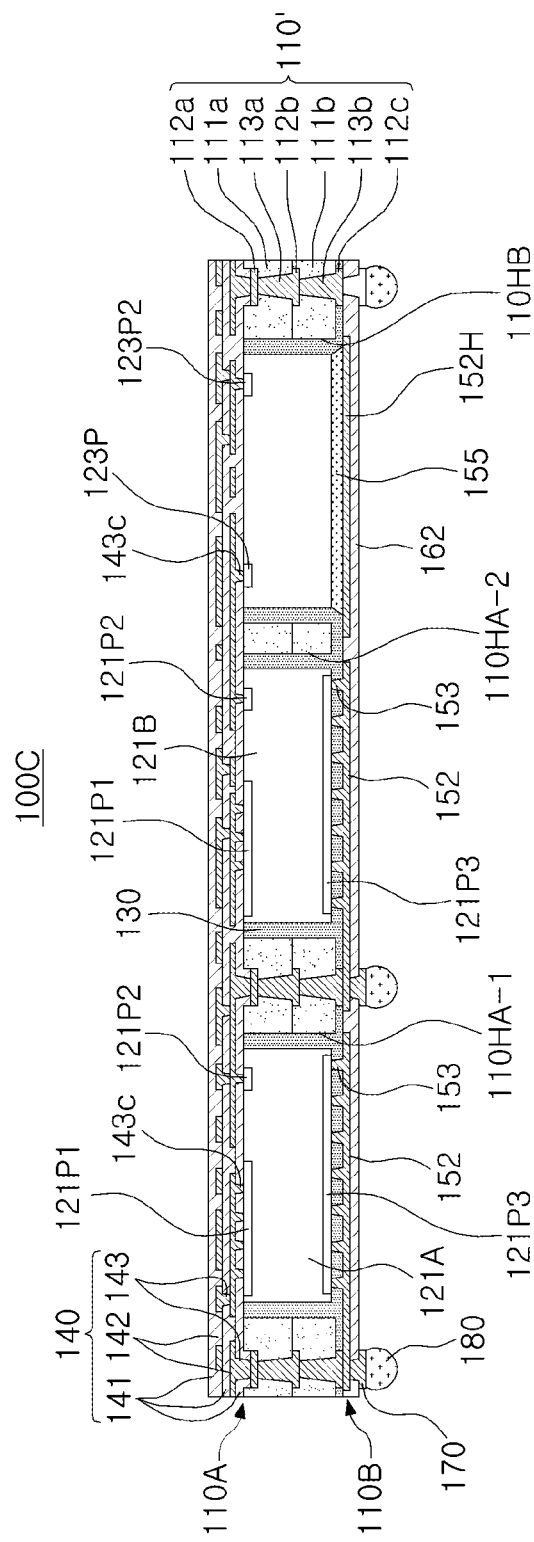

In the semiconductor package 100B, the second pad 121P3 of the first semiconductor chip 121 and the wiring layer 152 may be connected by a conductive bonding layer 155. As illustrated in FIG. 12, the encapsulant 130 is partially removed so that the second pad 121P3 of the first semiconductor chip 121 is exposed and the wiring layer 152 may be bonded using the conductive bonding layer 155. For example, the conductive bonding layer 155 may include a thermal interface material (TIM), a conductive epoxy, or a solder.

In the present exemplary embodiment, the heat dissipation layer 152h may be provided with the conductive bonding layer 155 in a region where the encapsulant 130 was partially removed, so as to be bonded to the inactive surface of the second semiconductor chip 122, as with the wiring layer 152. The heat dissipation layer 152h may include a plate-shaped metal body.

The semiconductor package 100B may use a surface opposite to the semiconductor package 100A according to the previous exemplary embodiment, as a mounting surface MT. Specifically, as illustrated in FIG. 12, the semiconductor package 100B includes a passivation layer 161 disposed on the connection structure 140, and the passivation layer 161 has a plurality of openings through which portions of the redistribution layer 142 are exposed.

The semiconductor package 100B may include the UBM layer 170 electrically connected to the redistribution layer 142 through the opening of the passivation layer 161. The electrically connecting metal 180 may be electrically connected to the redistribution layer 142 by the UBM layer 170. Unlike the previous exemplary embodiment, the connection structure 140 employed in this exemplary embodiment may include the three-level redistribution layer 142, and in another exemplary embodiment, the connection structure 140 may include a redistribution layer having different levels (e.g., four levels or greater).

FIG. 12 is a schematic cross-sectional view illustrating a semiconductor package according to an exemplary embodiment in the present disclosure.

Referring to FIG. 12, a semiconductor package 100C according to the present exemplary embodiment may be understood to be similar to the structures illustrated in FIGS. 9 and 10, except that it includes a plurality of first semiconductor chips and that a second semiconductor chip, a connecting structure, a frame, and a wiring structure of a heat dissipation layer are different. For components of the present exemplary embodiment, the descriptions of the components which are the same as or similar to those of the semiconductor package 100A illustrated in FIGS. 9 and 10 may be referred to unless otherwise mentioned.

The semiconductor package 100C may include a plurality of first semiconductor chips 121A and 121B instead of passive components, as compared with the previous exemplary embodiment. The frame 110' may include a plurality of first through holes 110HA-1 and 110HA-2 and a second through hole 110HB, and the first semiconductor chips 121A and 121B may be disposed in the plurality of first through holes 110HA-1 and 110HA-2, respectively. The first semiconductor chips 121A and 121B may each include first pads 121P1 and 121P2 and a second pad 121P3 disposed on each of opposing surfaces of the first semiconductor chip 121A and 121B, and each of the first and second pads 121P1 and 121P2 and 121P3 may be connected to the redistribution layer 142 and the wiring layer 152. The first semiconductor chips 121A and 121B may be electrically connected to the second semiconductor chip 122 through the redistribution layer 142 and the wiring layer 152. For example, the first semiconductor chips 121A and 121B are power device chips, the second semiconductor chip 122 includes a control IC chip, and the power device chip includes at least one of an IGBT chip and an FET chip. In another exemplary embodiment, the second semiconductor chip 122 may be provided in plurality, and the frame may also include additional through holes therefor.

In this exemplary embodiment, the second pad 121P3 of the first semiconductor chips 121A and 121B and the wiring layer 152 may be connected by the vias 153, and an inactive surface of the second semiconductor chip 122 and the heat dissipation layer 152h may be connected by the conductive bonding layer 155.

The frame 110' employed in this exemplary embodiment includes first and second insulating layers 111a and 111b providing the first and second surfaces 110A and 110B, respectively. The wiring structure includes a first wiring pattern 112a which is embedded in the first insulating layer 111a and is in contact with the connection structure 140, a second wiring pattern 112b disposed on a side of the first insulating layer 111a opposite to the side where the first wiring pattern 112a is embedded, a third wiring pattern 112c disposed on aside of the second insulating layer 111b opposite to the side where the second wiring pattern 112b is positioned, a first wiring via 113a penetrating through the first insulating layer 111a and connecting the first and second wiring patterns 112a and 112b, and a second wiring via 113b penetrating through the second insulating layer 111b and connecting the second and third wiring patterns 112b and 112c.

In this exemplary embodiment, the first wiring pattern 112a may be recessed into the first insulating layer 111a. In the case where the first wiring pattern 112a is recessed into the first insulating layer 111a and thus a lower surface of the first insulating layer 111a and a lower surface of the first wiring pattern 112a have a step, a material for forming the encapsulant 130 may be prevented from bleeding to contaminate the first wiring pattern 112a.

Figure 13:
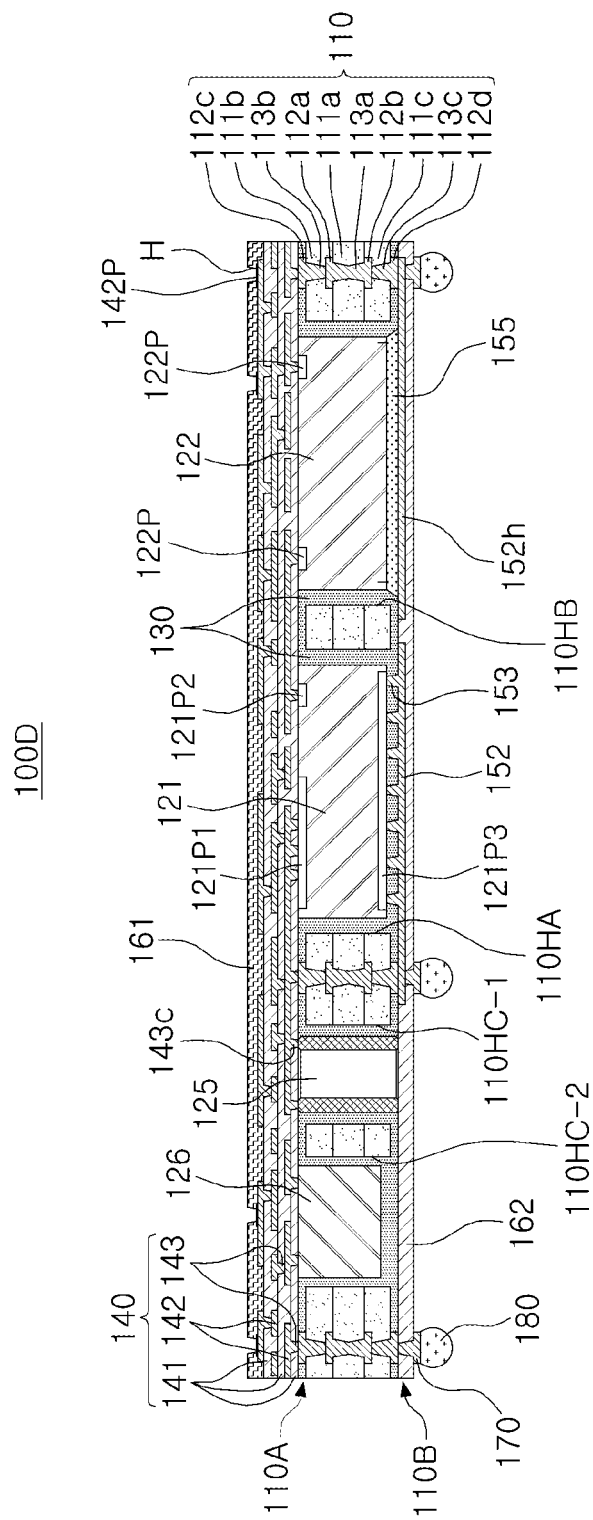

FIG. 13 is a schematic cross-sectional view illustrating a semiconductor package according to an exemplary embodiment in the present disclosure.

Referring to FIG. 13, a semiconductor package 100D according to the present exemplary embodiment may be understood to be similar to the structures illustrated in FIGS. 9 and 10, except that the semiconductor package 100D includes a plurality of third through holes accommodating various passive components, that a connecting structure of the semiconductor chip and a heat dissipation layer is different, and that a structure for a package-on-package (POP) is employed. For components of the present exemplary embodiment, the descriptions of the components which are the same as or similar to those of the semiconductor package 100A illustrated in FIGS. 9 and 10 may be referred to unless otherwise mentioned.

The frame 110 employed in the present exemplary embodiment may further include a plurality of third through holes 110HC-1 and 110HC-2 in addition to the first and second through holes 110HA and 110HB. The third through holes 110HC-1 and 110HC-2 are provided as two through holes and may include a chip capacitor 125 and a chip inductor 126, respectively. The chip capacitor 125 and the chip inductor 126 may have a connection terminal connected to the redistribution layer 142.

Also, in this exemplary embodiment, similar to the previous exemplary embodiment (FIG. 12), the second pads 121P3 of the first semiconductor chips 121A and 121B and the wiring layer 152 may be connected by the via 153 and the inactive surface of the second semiconductor chip 122 and the heat dissipation layer 152h may be connected by the conductive bonding layer 155.

The semiconductor package 100D is configured such that the second surface 110B of the frame 110 is used as a mounting surface (see FIG. 9) and another semiconductor chip or another semiconductor package is mounted on an upper surface of the connection structure 140. Specifically, as illustrated in FIG. 13, the semiconductor package 100D includes a passivation layer 161 disposed on the connection structure 140 and having a plurality of openings H. A surface treatment layer 142P may be formed on portions exposed through the plurality of openings H. The surface treatment layer 142P is not limited thereto and may be formed through, for example, electrolytic gold plating, electroless gold plating, OSP or electroless tin plating, electroless silver plating, electroless nickel plating/displacement gold plating, DIG plating, HASL, and the like.

Figure 14:
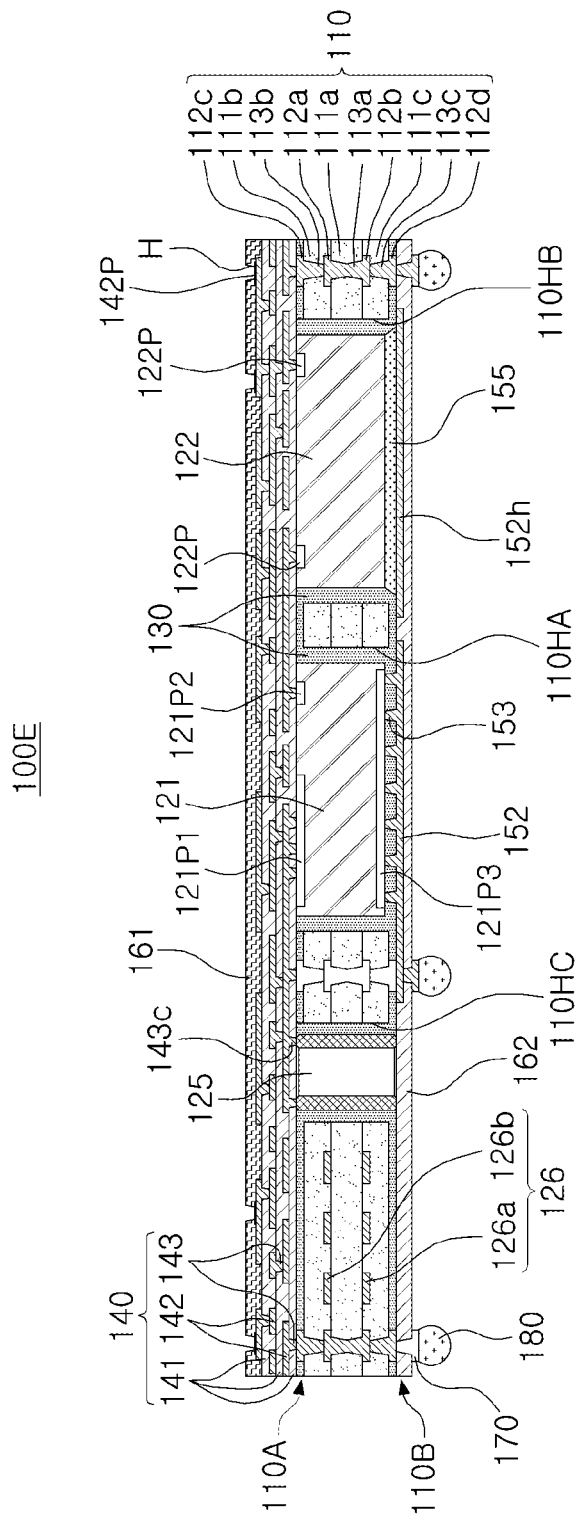

FIG. 14 is a schematic cross-sectional view illustrating a semiconductor package according to an exemplary embodiment in the present disclosure.

Referring to FIG. 14, a semiconductor package 100E according to the present exemplary embodiment may be understood to be similar to the structures illustrated in FIGS. 9 and 10, except that a passive component is realized using a wiring structure of the frame 110, that a connecting structure of a second semiconductor chip and a heat dissipation layer is different, and that a structure for a POP is employed. For components of the present exemplary embodiment, the descriptions of the components which are the same as or similar to those of the semiconductor package 100A illustrated in FIGS. 9 and 10 may be referred to unless otherwise mentioned.

Figure 15:
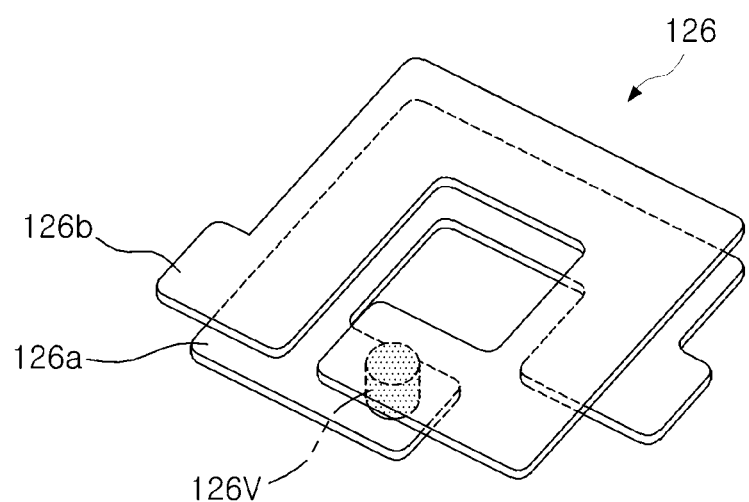
FIG. 15 is a schematic perspective view illustrating an embedded inductor employed in the semiconductor package of FIG. 14.

The semiconductor package 100D may include an embedded inductor 126 realized as an embedded trace structure (i.e., a wiring structure) in the frame 110. As illustrated in FIG. 15, the embedded inductor 126 includes first and second coil patterns 126a and 126b disposed on opposing surfaces of the first insulating layer 111a of the frame 110 and a coil via 126v penetrating through the first insulating layer 111a and connecting the first and second coil patterns 126a and 126b. The embedded inductor 126 may be formed using electrolytic copper plating or electroless copper plating, together with a wiring structure. The embedded inductor 126 may be connected to the wiring structure of the frame 110 and electrically connected to other circuits, the first and second semiconductor chips 121 and 122, and the like. In addition, a plurality of embedded inductors may be included at other positions of the frame 110.

In this exemplary embodiment, similarly to the previous exemplary embodiments (FIGS. 12 and 13), the second pad 121P3 of the first semiconductor chip 121 and the wiring layer 152 may be connected by the via 153, and the inactive surface of the second semiconductor chip 122 and the heat dissipation layer 152h may be connected by the conductive bonding layer 155.

The semiconductor package 100E may be configured such that another semiconductor chip or another semiconductor package may be mounted on an upper surface of the connection structure 140, similar to the previous exemplary embodiment (FIG. 13). Specifically, as illustrated in FIG. 14, the semiconductor package 100E includes a passivation layer 161 disposed on the connection structure 140 and having a plurality of openings H. The surface treatment layer 142P may be formed on portions exposed through the plurality of openings H.

As set forth above, according to exemplary embodiments in the present disclosure, the semiconductor package for a power module having various structures may be realized using the redistribution layer formation and embedding technique. By replacing wire bonding with the redistribution layer structure, a package area and thickness may be reduced. It is possible to change the design of the package relatively freely to include various additional part such as a heat dissipating part and a passive component.

Various and advantageous advantages and effects of the present inventive concept are not limited to those described above and may be more easily understood in the course of describing the specific example embodiment of the present inventive concept.

While exemplary embodiments have been shown and described above, it will be apparent to those skilled in the art that modifications and variations could be made without departing from the scope of the present disclosure as defined by the appended claims.

What is claimed is:

1. A semiconductor package comprising:
a frame having first and second surfaces opposing each other, having first and second through holes, and including a wiring structure connecting the first and second surfaces;
a connection structure disposed on the first surface of the frame and having a redistribution layer connected to the wiring structure;
a first semiconductor chip disposed on the connection structure in the first through hole and having a first surface having first pads connected to the redistribution layer and a second surface opposite to the first surface and having a second pad;
a second semiconductor chip disposed on the connection structure in the second through hole and having an active surface having a connection pad connected to the redistribution layer and an inactive surface opposite to the active surface;
an encapsulant encapsulating the first and second semiconductor chips;
a wiring layer disposed on the encapsulant and the second surface of the frame and connected to the second pad of the first semiconductor chip and the wiring structure; and
a heat dissipation layer disposed in a region of the encapsulant corresponding to the inactive surface of the second semiconductor chip,
wherein the heat dissipation layer is positioned at the same level as that of the wiring layer.

2. The semiconductor package of claim 1, wherein the wiring layer is connected to the second pad of the first semiconductor chip through a plurality of vias disposed in the encapsulant.

3. The semiconductor package of claim 1, wherein the encapsulant has an opening exposing at least a portion of the second surface of the first semiconductor chip and the wiring layer is connected to the second pad by a conductive adhesive member in the opening of the encapsulant.

4. The semiconductor package of claim 1, wherein the heat dissipation layer includes a same material as that of the wiring layer.

5. The semiconductor package of claim 1, wherein the heat dissipation layer is connected to the inactive surface of the second semiconductor chip through a plurality of vias disposed in the encapsulant.

6. The semiconductor package of claim 1, wherein the first semiconductor chip is a power device chip and the second semiconductor chip includes a control integrated circuit (IC) chip.

7. The semiconductor package of claim 6, wherein the power device chip includes one of an insulated gate bipolar transistor (IGBT) including an emitter electrode, a gate electrode, and a collector electrode, or a field effect transistor (FET) chip including a source electrode, a gate electrode, and a drain electrode.

8. The semiconductor package of claim 7, wherein one of the first pads is one of the emitter electrode and the collector electrode of the IGBT, another of the first pads is the gate electrode of the IGBT, and the second pad is another of the emitter electrode and the collector electrode of the IGBT, or
one of the first pads is one of the source electrode and the drain electrode of the FET, another of the first pads is the gate electrode of the FET, and the second pad is another of the source electrode and the drain electrode of the FET.

9. The semiconductor package of claim 1, wherein the frame further includes a third through hole and the semiconductor package further includes a third semiconductor chip or a passive component accommodated in the third through hole.

10. The semiconductor package of claim 1, wherein the frame includes a plurality of insulating layers, the wiring structure includes a plurality of wiring patterns respectively disposed in the plurality of insulating layers and wiring vias connecting the plurality of wiring patterns, and the frame further includes an inductor including some of the plurality of wiring patterns and the at least one of the wiring vias.

11. The semiconductor package of claim 1, wherein the frame includes first and second insulating layers sequentially disposed on the connection structure, and
the wiring structure includes a first wiring pattern embedded in the first insulating layer and in contact with the connection structure, a second wiring pattern disposed on a side of the first insulating layer opposite to the side where the first wiring pattern is embedded, a third wiring pattern disposed on a side of the second insulating layer opposite to the side where the second wiring pattern is positioned, a first wiring via penetrating through the first insulating layer and connecting the first and second wiring patterns, and a second wiring via penetrating through the second insulating layer and connecting the second and third wiring patterns.

12. The semiconductor package of claim 1, wherein the frame includes a first insulating layer and second and third insulating layers respectively disposed on opposing surfaces of the first insulating layer, and
the wiring structure includes first and second wiring patterns respectively disposed on the opposing surfaces of the first insulating layer, a third wiring pattern disposed on the second insulating layer, a fourth wiring pattern disposed on the third insulating layer, a first wiring via penetrating through the first insulating layer and connecting the first and second wiring patterns, a second wiring via penetrating through the second insulating layer and connecting the second and third wiring patterns, and a third wiring via penetrating through the third insulating layer and connecting the third and fourth wiring patterns.

13. The semiconductor package of claim 1, further comprising:
a passivation layer covering the second surface of the frame and the wiring layer; and
an underbump metal (UBM) layer electrically connecting the wiring structure through the passivation layer.

14. The semiconductor package of claim 1, further comprising a passivation layer covering the connection structure and having a plurality of openings exposing portions of the redistribution layer.

15. A semiconductor package comprising:
a frame having first and second surfaces opposing each other, having a first through hole and a second through hole, the frame including a plurality of insulating layers and a wiring structure connecting the first and second surfaces;
a connection structure disposed on the first surface of the frame and having a redistribution layer connected to the wiring structure;
a first semiconductor chip disposed in the first through holes, and having a first surface having first pads connected to the redistribution layer and a second surface opposite to the first surface of the first semiconductor chip and having a second pad;
a second semiconductor chip disposed on the connection structure in the second through hole and having an active surface having a connection pad connected to the redistribution layer and an inactive surface opposite to the active surface;
an encapsulant encapsulating the first semiconductor chip; and
a wiring layer disposed on the encapsulant and the second surface of the frame and connected to the second pad of the first semiconductor chip and the wiring structure,
wherein the wiring structure includes a plurality of wiring patterns respectively disposed in the plurality of insulating layers and wiring vias connecting the plurality of wiring patterns, and the frame further includes an inductor having some of the plurality of wiring patterns and at least one of the wiring vias.

16. The semiconductor package of claim 15, wherein the first semiconductor chip is a power device chip including one of an insulated gate bipolar transistor (IGBT) including an emitter electrode, a gate electrode, and a collector electrode, or a field effect transistor (FET) chip including a source electrode, a gate electrode, and a drain electrode.

17. The semiconductor package of claim 16, wherein one of the first pads of the power device chip is one of the emitter electrode and the collector electrode of the IGBT, another of the first pads of the power device chip is the gate electrode of the IGBT, and the second pad of the power device chip is another of the emitter electrode and the collector electrode of the IGBT, or
one of the first pads of the power device chip is one of the source electrode and the drain electrode of the FET, another of the first pads of the power device chip is the gate electrode of the FET, and the second pad of the power device chip is another of the source electrode and the drain electrode of the FET.

18. The semiconductor package of claim 15, wherein the frame further includes another through hole and the semiconductor package further includes a passive component accommodated in the another through hole.

19. A semiconductor package comprising:
- a frame having first and second surfaces opposing each other, having first and second through holes, and including a wiring structure connecting the first and second surfaces;
- a connection structure disposed on the first surface of the frame and having a redistribution layer connected to the wiring structure;
- a first semiconductor chip disposed on the connection structure in the first through hole and having a first surface having first pads connected to the redistribution layer and a second surface opposite to the first surface and having a second pad;
- a second semiconductor chip disposed on the connection structure in the second through hole and having an active surface having a connection pad connected to the redistribution layer and an inactive surface opposite to the active surface;
- an encapsulant encapsulating the first and second semiconductor chips;
- a wiring layer disposed on the encapsulant and the second surface of the frame and connected to the second pad of the first semiconductor chip and the wiring structure; and
- a heat dissipation layer disposed in a region of the encapsulant corresponding to the inactive surface of the second semiconductor chip,
- wherein the encapsulant has an opening exposing at least a portion of the inactive surface of the second semiconductor chip and the heat dissipation layer is connected to a conductive adhesive member in the opening of the encapsulant.

* * * * *